(12) United States Patent
Kniffin et al.

(10) Patent No.: US 7,530,039 B2
(45) Date of Patent: May 5, 2009

(54) METHODS AND APPARATUS FOR SIMULATING DISTRIBUTED EFFECTS

(75) Inventors: Margaret L. Kniffin, Tempe, AZ (US);
Dmitry S. Shipitsin, Moscow (RU);
Michael J. Zunino, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 320 days.

(21) Appl. No.: 11/524,655

(22) Filed: Sep. 21, 2006

(65) Prior Publication Data

US 2007/0288882 A1 Dec. 13, 2007

(51) Int. Cl.
*G06F 17/50* (2006.01)
(52) U.S. Cl. .......................... 716/12; 716/11
(58) Field of Classification Search ............... 716/7–12
See application file for complete search history.

(56) References Cited

U.S. PATENT DOCUMENTS 6,484,300 B1 * 11/2002 Kim et al. .................... 716/7
6,519,752 B1    2/2003 Bakker et al.
7,016,820 B2 *  3/2006 Kimura et al. ............... 703/2
7,278,120 B2 * 10/2007 Rahmat et al. ............... 716/2

FOREIGN PATENT DOCUMENTS

| JP | 2000243971 | 9/2000 |
| JP | 2002318829 | 10/2002 |
| JP | 2003110114 | 4/2003 |
| JP | 20040784428 | 3/2004 |
| JP | 2005242398 | 9/2005 |

* cited by examiner

*Primary Examiner*—Jack Chiang
*Assistant Examiner*—Binh C Tat
(74) *Attorney, Agent, or Firm*—Ingrassia, Fisher & Lorenz, P.C.

(57) ABSTRACT

In general, various embodiments of the present invention relate to systems and methods for simulating distributed effects by providing a meshing pattern (200) (e.g., a two-dimensional meshing pattern that is part of a recognition layer), applying that meshing pattern to the physical layout (100), and partitioning the physical layout into a three-dimensional netlist (300) of components derived from the unit cells defined by the meshing pattern (200), thereby modeling the parasitics within the design.

28 Claims, 3 Drawing Sheets

METHODS AND APPARATUS FOR SIMULATING DISTRIBUTED EFFECTS

CROSS REFERENCE TO RELATED APPLICATIONS

This application claims priority to International Application Serial Number PCT/RU/2006/000304 filed Jun. 13, 2006.

FIELD OF THE INVENTION

The present invention generally relates to large-area semiconductor devices and, more particularly, to methods for simulating parasitic effects in large-area devices.

BACKGROUND OF THE INVENTION

The modeling of large-area semiconductor devices is complicated by the presence of distributed effects—i.e., parasitic capacitances, inductances, and resistances that are inherent in the device and interconnect structure. Such parasitics typically lead to non-uniform current flow and non-uniform behavior across the device, and can therefore significantly degrade the assumed scaling relationships while having a substantial impact on real-world performance of the design. In power metal-oxide semiconductor field effect transistors (MOSFETs), for example, the distributed parasitic resistances associated with the metal interconnects in large-area devices can reduce the achievable Rds(on)-area product of the MOSFET by 30% or more. Accordingly, it is desirable for parasitics to be accurately accounted for during simulation.

Since the contribution of parasitics to performance is strongly dependent on both the configuration of the device and the location of the external pin connections, accurate modeling preferably takes into account final device layout. One way of modeling and optimizing the performance of large area devices from the device layout is to represent the device as a three-dimensional distributed network of active and passive elements. These elements and their interconnection, which reflect the layout of the device, are distilled into a suitable "netlist." However, generation of this netlist from the layout, in a standard analog design flow, is not straightforward. Furthermore, known methods of generating this netlist typically overestimate and/or underestimate the effects of various physical features.

Accordingly, there is a need for more efficient and accurate methods for simulating distributed effects in semiconductor device. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. Conventional terms and processes relating to semiconductor manufacturing, component modeling, device layout, and simulation techniques are known to those skilled in the art, and are therefore not discussed in detail herein.

In general, various embodiments of the present invention relate to systems and methods for simulating distributed effects by providing a meshing pattern (e.g., a two-dimensional meshing pattern that is part of a recognition layer), applying that meshing pattern to the physical layout, and partitioning the physical layout into a three-dimensional netlist of components derived from the unit cells, thereby modeling the parasitics within the design.

Figure 1:
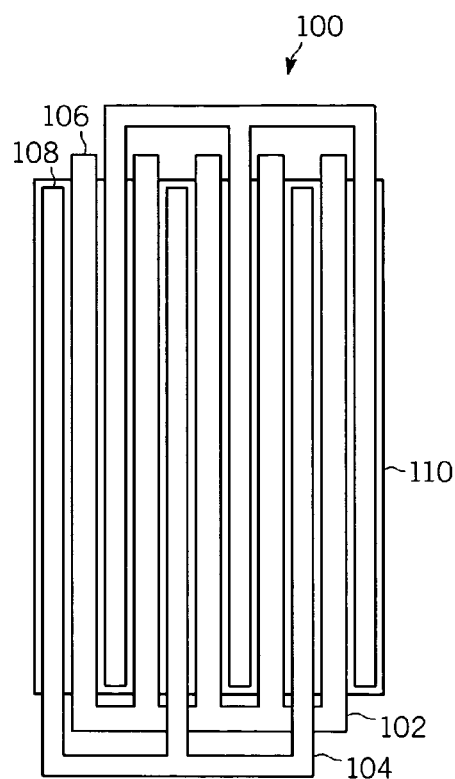
FIG. 1 is a top view of an exemplary large area device.
Figure 6:
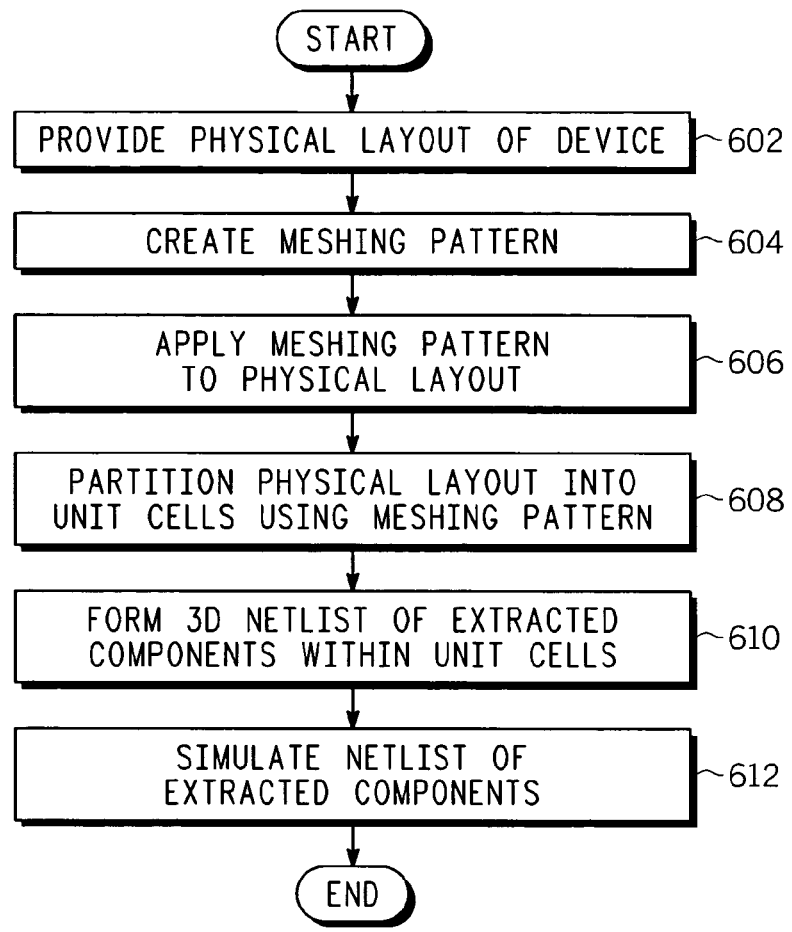
FIG. 6 is a flow chart depicting a method in accordance with one embodiment.

Referring to FIG. 1 in conjunction with the flowchart shown in FIG. 6, an exemplary simulation method will now be described. It will be appreciated that the illustrated steps may include various intervening steps, and may also be part of a larger process.

First, in step 602, a physical layout of a device is provided. In this regard, FIG. 1 is a top view of a physical layout (or simply "layout") 100 corresponding to an example device design. Layout 100 will typically include multiple drawing layers that map to various diffusions, interconnects, vias, dielectrics, bulk semiconductor regions, and other such semiconductor structures known in the art. Many commercial software packages exist for making such physical layouts, e.g., any of the various layout software products offered by Cadence Design Systems.

The device being represented by physical layout 100 may be any type of semiconductor device, e.g., an analog device such as a metal-oxide-semiconductor field effect transistor (MOSFET), a bipolar power transistor, or the like. As described above, the present invention has particular utility when applied to large-area devices. In general, a large-area device is a device which is expected to have spatially non-uniform performance, and is not constrained to particular physical size. While the illustrated embodiment involves a MOSFET device, the present invention is not so limited, and may be applied to any semiconductor device.

As shown in FIG. 1, layout 100 in this embodiment includes source metallization 102, drain metallization 104, and active area 110. Drain metallization 104 includes extended fingers 108, and likewise source metallization 102 includes fingers 106. The fingers 106 and 108 are interdigitated. Various external pins, vias, contacts, leads, wirebonds, and other interconnects might also be included in the layout, but for the purpose of simplicity are not included in FIG. 1. Active area 110 includes various diffusions, gate oxide layers, etc. as may be appropriate.

Figure 2:
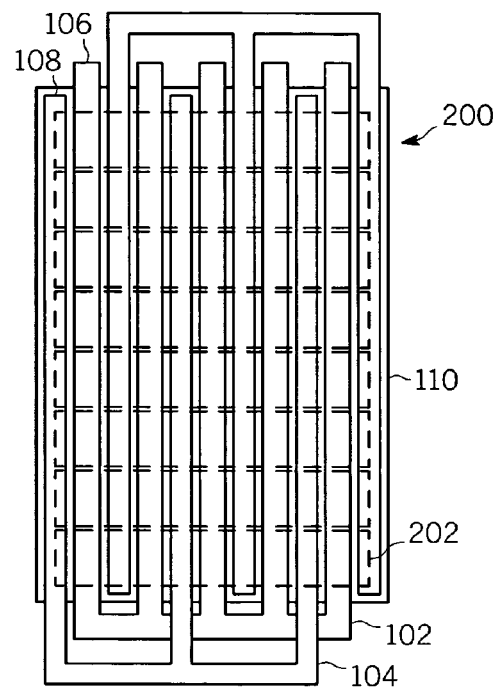
FIG. 2 is the top view of FIG. 1 with a meshing pattern superimposed thereon.

In step 604, a suitable meshing pattern is created. In FIG. 2, mesh pattern (or simply "mesh") 200 is a regular two-dimensional array of rectangles. Meshing pattern 200 may have any convenient resolution (i.e., spacing between nodes) and geometry. For example, meshing pattern might consist of three-dimensional rectilinear or curvilinear shapes having uniform or non-uniform sizes. In one embodiment, meshing pattern 200 is a regular array of rectangular regions having a resolution sufficient to model the device at the desired level of accuracy. Depending upon the device, this resolution may be on the order of a micron, tens of microns, or any other resolution matched to the feature size of the device. For example, in the case where FET fingers are being modeled, it may be convenient for the mesh pattern to have a resolution on the order of the distance between adjacent fingers.

Mesh pattern 200 may be created using any convenient method. For example, it might be automatically generated by a computer using a suitable algorithm, or it may be defined manually. Mesh 200 may be included in an extraction layer that is part of the drawing itself, or may be generated automatically during creation of the drawing layers.

In step 606, the meshing pattern is applied to the physical layout. This is shown conceptually in FIG. 2, where mesh pattern 200 is superimposed on physical layout 100. Mesh pattern 200 may be aligned with physical layout 100 in any convenient manner, depending upon the nature of the layout (i.e., feature sizes, shapes, and areas of interest).

After the meshing pattern has been applied, the system partitions the physical layout into unit cells (step 608). That is, regardless of how mesh 200 is positioned, it will be seen that various structures of physical layout 100 fall within different individual mesh regions (e.g., region 202) that make up mesh pattern 200. Mesh region 202, for example, includes portions of metallization 106, portions of metallization 108, and portions of active area 110.

These structures are suitably separated to form a network of smaller, equivalent devices. In one embodiment, this partitioning includes (1) segmenting the core device, (2) forcing fragmentation of metal layers, and optionally collating vias and contacts.

Segmenting the core device generally involves treating portions of the physical device within a particular mesh element as an individual component separated in space from neighboring components (and reconnected using nearby conductive layers). This step includes, among other things, breaking connectivity within diffusions defined by the physical layout, as layout 100 will typically include defined diffusion regions, e.g., source diffusions, drain diffusions, and the like.

Figure 4:
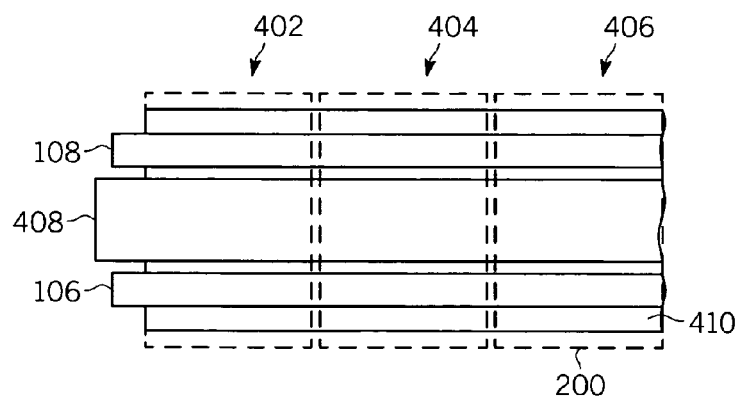
FIG. 4 is a top view close-up of an exemplary physical layout.

Referring to FIG. 4, for example, which depicts a top-view close-up of an exemplary MOSFET finger region, the meshing pattern 200 defines regions 402, 404, and 406. These regions form a boundary containing portions of finger metallization 108, finger metallization 106, and polysilicon gate 408. A drain diffusion, source diffusion, gate oxide, and one or more other layers will typically be present below these illustrated layers. For example a diffusion layer 410 (e.g., a source diffusion) is shown.

Figure 5:
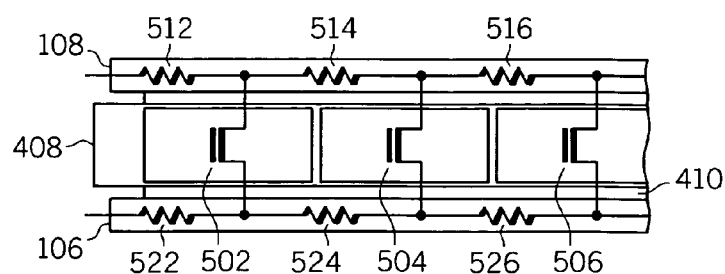
FIG. 5 depicts the top view of FIG. 4 with superimposed extracted components.

Referring now to FIG. 5, portions of metallization 108 within regions 402, 404, and 406 are modeled as resistors 512, 514, and 516. Likewise, portions of metallization 106 within these regions are modeled as resistors 522, 524, and 526, respectively. Finally, portions of active area 110 within these regions are modeled as FETs 502, 504, and 506, respectively, as the core device (e.g., the underlying MOSFET structure) has been segmented into individual components 502-506.

As shown, the connectivity of diffusion 410 (as well as polysilicon gate 408) has been broken such that each section of the FET finger, as defined by the meshing pattern, is considered an individual FET. These individual FETS are modeled as being connected by metal layers as shown, wherein the metal layers have themselves been fragmented into equivalent resistances. Forcing fragmentation of metal layers involves treating segments of metallization within a particular mesh element as a separate, discrete conductive element that is connected to any neighboring elements, as shown in FIG. 5.

Collating vias and contacts involves merging all same-kind vias and contacts within a mesh region, or otherwise simplifying the via and contact patterns to avoid any unwanted results. The desired result is to produce a single vertical connection between each of the various conductive layer regions defined by a mesh element.

Figure 3:
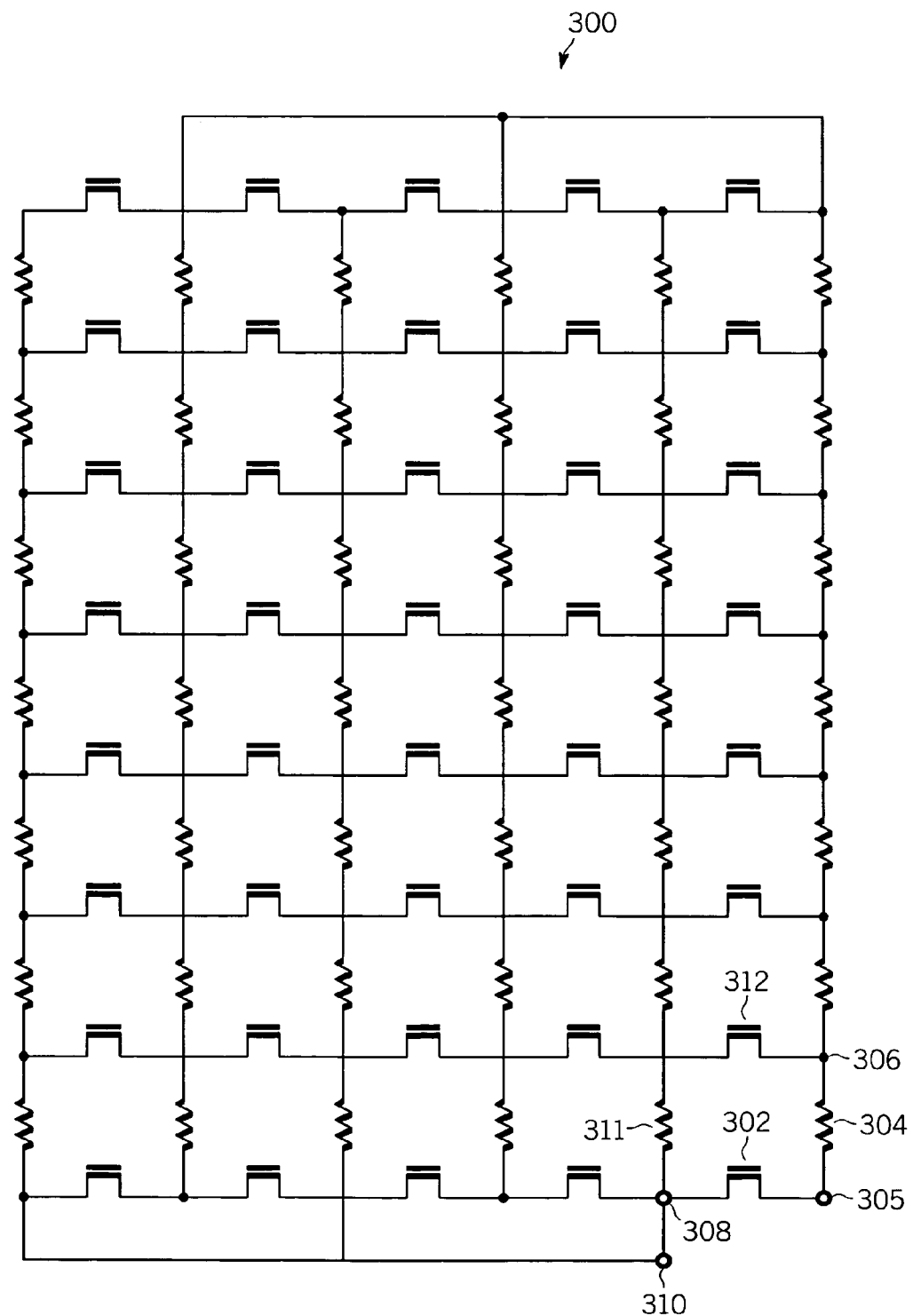
FIG. 3 is a network of components modeling the large area device of FIG. 1.

In step 610, once components have been extracted from the physical layout, a netlist is created from the components extracted from the various unit cells. FIG. 3 is a pictorial representation 300 of extracted netlist components. In the illustrated embodiment, these netlist components include FET devices and resistors; however, any other active or passive component may be extracted as appropriate. Thus, in the illustrated embodiment, a resistance 304 is included between nodes 306 and 305, and a FET 302 is included between nodes 305 and 308. Note that certain regions of metallization might be treated as a single node (e.g., 308 and 310). Thus, the unit cell 202 of FIG. 2 is used to extract four components (FETs 302 and 312, and resistors 311 and 304) which are also shared by two adjacent unit cells.

The model of FIG. 3 is embodied in a suitable "netlist,"— i.e., a file that specifies the components and connectivity of the network. That is, the netlist includes physical properties of the components (i.e., passive and active components) as well as topological information regarding how those components are connected. Netlists can be physical or logical. They can also be instance-based, net-based, flat, or hierarchical. The term "3D netlist" means that its topology is related, in three dimensions, to the device's physical layout (i.e., as apposed to a two-dimensional netlist, which corresponds to a planar graph). In one embodiment, the netlist corresponds to a conventional netlist produced for use by SPICE (Simulation Program with Integrated Circuit Emphasis), a popular analog circuit simulator. The nature of such netlists are known in the art, and need not be described in detail herein.

After a netlist is created, a suitable simulation program is used to simulate operation of the extracted components in the netlist and to determine parasitic effects of the equivalent network (step 612). Such simulation programs are well known in the art, and thus need not be detailed herein.

Figure 7:
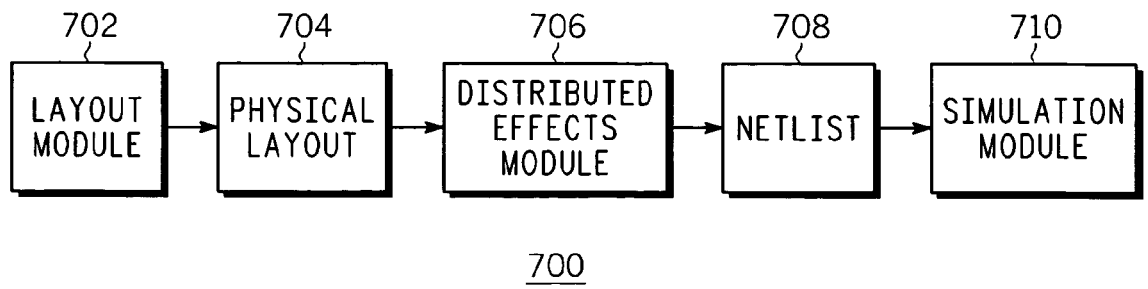
FIG. 7 is a conceptual block diagram of a system in accordance with one embodiment.

It will be appreciated that the method described above may be carried out in hardware, software, firmware, or a combination thereof. In one embodiment, the method is implemented as one or more software modules running on a suitable computer workstation having one or more CPUs, various input/output devices, a display, a memory, mass storage, a network interface, and other such conventional components. In accordance with one embodiment, shown conceptually in FIG. 7, the system 700 includes a layout module 702 configured to provide a physical layout 704 of the semiconductor device, and a distributed effects module 706 configured to provide a meshing pattern, superimpose the meshing pattern on the physical layout, partition the physical layout into unit cells in accordance with the meshing pattern, and form a netlist 708 of components extracted from the unit cells. The system includes a simulation module 710 configured to simulate electrical operation of netlist 708 and determine the distributed effects associated therewith. These modules may be part of the same software package running on a single workstation, or may distributed in any convenient manner.

In summary, what has been described is a method for simulating distributed effects associated with a semiconductor device. In one embodiment, the method includes: providing a physical layout of the semiconductor device; providing a meshing pattern; superimposing the meshing pattern on the physical layout; partitioning the physical layout into unit cells in accordance with the meshing pattern; forming a netlist of components extracted from the unit cells; and simulating electrical operation of the netlist of unit cells and determining the distributed effects associated therewith.

In various embodiments, the meshing pattern is a regular two-dimensional pattern—e.g., a regular array of rectangular regions. The rectangular regions may have a size selected in accordance with a feature size of the physical layout.

In a particular embodiment, partitioning the physical layout into unit cells includes segmenting a core device within the physical layout and/or fragmenting a metal layer within the physical layout and/or collating a set of vias and a set of contacts within the physical layout.

In one embodiment, the physical layout includes a source finger and an associated drain finger, wherein the meshing pattern is configured such that a mesh region within the meshing pattern has a width substantially equal to a distance between the source finger and the drain finger.

In one embodiment, the method includes providing an extraction layer within an extraction deck associated with the physical layout. Alternatively, the method includes automatically generating the meshing pattern during the step of providing the physical layout. This may include construction of a "virtual" mesh pattern via an algorithm, or simply using code to draw a mesh pattern in the recognition layer.

In accordance with one embodiment, a system for simulating distributed effects in a semiconductor device includes: a layout module configured to provide a physical layout of the semiconductor device; a distributed effects module configured to provide a meshing pattern, superimpose the meshing pattern on the physical layout, partition the physical layout into unit cells in accordance with the meshing pattern, and form a netlist of components extracted from the unit cells; and a simulation module configured to simulate electrical operation of the netlist and determine the distributed effects associated therewith.

In one embodiment, the meshing pattern is a regular array of rectangular regions, for example, rectangular regions having a size selected in accordance with a feature size of the physical layout.

In one embodiment, the distributed effects module partitions the physical layout into unit cells by segmenting a core device within the physical layout, fragmenting a metal layer within the physical layout, and collating a set of vias and a set of contacts within the physical layout.

In accordance with another embodiment, a method for generating a netlist of components associated with parasitic effects in a semiconductor device defined by a physical layout includes the steps of: providing a meshing pattern; breaking connectivity within diffusions defined in said physical layout in accordance with the meshing pattern; segmenting metallization defined in said physical layout in accordance with the meshing pattern; and producing a netlist of equivalent components in accordance with the breaking connectivity step and the segmenting metallization step. The method may also include collating a set of vias and a set of contacts within the physical layout. The physical layout may include a plurality of drawing layers, wherein the meshing pattern comprises an extraction layer. In a particular embodiment, the meshing pattern comprises a two-dimensional array of rectangular mesh regions.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for simulating distributed effects associated with a semiconductor device that includes a first metallization, a second metallization, and an active area, the method comprising:
   providing a physical layout of the semiconductor device;
   providing a meshing pattern;
   superimposing the meshing pattern on the physical layout;
   partitioning the physical layout into unit cells in accordance with the meshing pattern;
   extracting components from the unit cells, wherein the components include
      a first set of series resistors that model the first metallization,
      a second set of series resistors that model the second metallization, and
      a set of devices between the first set of series resistors and the second set of series resistors that model the active area, wherein the set of devices include devices that correspond to a type of the semiconductor device;
   forming a netlist of the components extracted from the unit cells; and
   simulating electrical operation of the netlist of unit cells and determining the distributed effects associated therewith.

2. The method of claim 1, wherein the meshing pattern is a regular two-dimensional pattern.

3. The method of claim 1, wherein the meshing pattern is a regular array of rectangular regions.

4. The method of claim 3, wherein the rectangular regions have a size selected in accordance with a feature size of the physical layout.

5. The method of claim 1, wherein partitioning the physical layout into unit cells includes segmenting a core device within the physical layout.

6. The method of claim 1, wherein partitioning the physical layout into unit cells includes fragmenting a metal layer within the physical layout.

7. The method of claim 1, wherein partitioning the physical layout into unit cells includes collating a set of vias and a set of contacts within the physical layout.

8. The method of claim 1, wherein the semiconductor device is a field effect transistor, and the physical layout includes a source finger and an associated drain finger, and wherein the meshing pattern is configured such that a mesh region within the meshing pattern has a width substantially equal to a distance between the source finger and the drain finger.

9. The method of claim 1, wherein the step of providing a meshing pattern includes providing an algorithm configured to produce the meshing pattern.

10. The method of claim 1, further including generating the meshing pattern during the step of providing the physical layout.

11. The method of claim 1, wherein the semiconductor device is a large-area active device, and wherein the set of devices include active components.

12. The method of claim 1, wherein the semiconductor device is a transistor, and the set of devices include transistors.

13. The method of claim 1, wherein the semiconductor device is a field effect transistor, the first metallization is a first finger of the field effect transistor corresponding to a drain metallization, the second metallization is a second finger of the field effect transistor corresponding to a source metallization, and the set of devices include field effect transistors.

14. The method of claim 1, wherein:
partitioning the physical layout into the unit cells includes partitioning the physical layout so that a first unit cell includes a first portion of the first metallization, a first portion of the second metallization, and a first portion of the active area, and a second unit cell includes a second portion of the first metallization, a second portion of the second metallization, and a second portion of the active area; and wherein
extracting the components includes extracting the components from the first unit cell and the second unit cell so that
the first set of series resistors models the first portion of the first metallization and the second portion of the first metallization,
the second set of series resistors models the first portion of the second metallization and the second portion of the second metallization, and
the set of devices models the first portion of the active area and the second portion of the active area.

15. A system for simulating distributed effects in a semiconductor device that includes a first metallization, a second metallization, and an active area, the system comprising:
a layout module configured to provide a physical layout of the semiconductor device;
a distributed effects module configured to provide a meshing pattern, superimpose the meshing pattern on the physical layout, partition the physical layout into unit cells in accordance with the meshing pattern, extract components from the unit cells, wherein the components include a first set of series resistors that model the first metallization, a second set of series resistors that model the second metallization, and a set of devices between the first set of series resistors and the second set of series resistors that model the active area, wherein the set of devices include devices that correspond to a type of the semiconductor device, and the distributed effects module is further configured to form a netlist of the components extracted from the unit cells; and
a simulation module configured to simulate electrical operation of the netlist and determine the distributed effects associated therewith.

16. The system of claim 15, wherein the meshing pattern is a regular array of rectangular regions.

17. The system of claim 16, wherein the rectangular regions have a size selected in accordance with a feature size of the physical layout.

18. The system of claim 15, wherein the distributed effects module partitions the physical layout into unit cells by segmenting a core device within the physical layout.

19. The system of claim 15, wherein the distributed effects module partitions the physical layout into unit cells by fragmenting a metal layer within the physical layout.

20. The system of claim 15, wherein the distributed effects module partitions the physical layout into unit cells by collating a set of vias and a set of contacts within the physical layout.

21. The system of claim 15, wherein the semiconductor device is a large-area active device, and wherein the set of devices include active components.

22. The system of claim 15, wherein the semiconductor device is a transistor, and the set of devices include transistors.

23. A method for generating a netlist of components associated with parasitic effects in a semiconductor device defined by a physical layout, wherein the physical layout includes a first metallization, a second metallization, and an active area, and the method comprises:
providing a meshing pattern;
breaking connectivity within diffusions defined in said physical layout in accordance with the meshing pattern;
segmenting the first metallization and the second metallization defined in said physical layout in accordance with the meshing pattern;
extracting equivalent components based on the breaking and segmenting steps, wherein the components include
a first set of series resistors that model the first metallization,
a second set of series resistors that model the second metallization, and
a set of devices between the first set of series resistors and the second set of series resistors that model the diffusions, wherein the set of devices include devices that correspond to a type of the semiconductor device; and
producing a netlist of equivalent components in accordance with the breaking connectivity step and the segmenting metallization step.

24. The method of claim 23, wherein the physical layout includes a plurality of drawing layers, and the meshing pattern comprises an extraction layer.

25. The method of claim 23, wherein the meshing pattern is a two-dimensional array of rectangular mesh regions.

26. The method of claim 23, further including collating a set of vias and a set of contacts within the physical layout.

27. The method of claim 23, wherein the semiconductor device is a large-area active device, and wherein the set of devices include active components.

28. The method of claim 23, wherein the semiconductor device is a transistor, and the set of devices include transistors.

* * * * *